(12) United States Patent
Kane

(10) Patent No.: US 7,799,749 B2
(45) Date of Patent: Sep. 21, 2010

(54) STABILIZED, NON-AQUEOUS CLEANING COMPOSITIONS FOR MICROELECTRONICS SUBSTRATES

(75) Inventor: Sean M. Kane, Lyndhurst, OH (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 197 days.

(21) Appl. No.: 12/161,886

(22) PCT Filed: Jan. 31, 2007

(86) PCT No.: PCT/US2007/002911

§ 371 (c)(1),
(2), (4) Date: Jul. 23, 2008

(87) PCT Pub. No.: WO2007/097897

PCT Pub. Date: Aug. 30, 2007

(65) Prior Publication Data

US 2009/0005283 A1    Jan. 1, 2009

Related U.S. Application Data

(60) Provisional application No. 60/773,463, filed on Feb. 15, 2006.

(51) Int. Cl.
*C11D 7/50* (2006.01)

(52) U.S. Cl. .......... 510/175; 510/407; 134/1.3
(58) Field of Classification Search .......... 510/175, 510/407; 134/1.3
See application file for complete search history.

(56) References Cited

U.S. PATENT DOCUMENTS

| 4,778,728 | A | 10/1988 | Lucas | |
| 5,308,745 | A | 5/1994 | Schwartzkopf | |
| 6,551,973 | B1 | 4/2003 | Moore | |
| 6,585,825 | B1 * | 7/2003 | Skee | 134/3 |
| 6,599,370 | B2 * | 7/2003 | Skee | 134/3 |
| 2002/0077259 | A1 * | 6/2002 | Skee | 510/175 |

FOREIGN PATENT DOCUMENTS

| EP | 1 128 222 | 8/2001 |
| WO | WO 2005/043245 | 5/2005 |
| WO | WO 2005/109108 | 11/2005 |

* cited by examiner

*Primary Examiner*—Gregory E Webb
(74) *Attorney, Agent, or Firm*—George W. Rauchfuss, Jr.; Ohlandt, Greeley, Ruggiero & Perle, L.L.P.

(57) ABSTRACT

Non-aqueous stripping and cleaning compositions for cleaning microelectronics devices, the composition having a least one organic sulfur-containing polar compound as a stripping solvent, at least one water-free source of a strong hydroxide base, and at least one hydroxypyridine stabilizing agent to inhibit detrimental side reactions.

16 Claims, No Drawings

STABILIZED, NON-AQUEOUS CLEANING COMPOSITIONS FOR MICROELECTRONICS SUBSTRATES

CROSS REFERENCE TO RELATED APPLICATIONS

This application is a national stage application of PCT/US2007/002911, filed Jan. 31, 2007, which claims the benefit of U.S. Provisional Application No. 60/773,463 filed Feb. 15, 2006.

FIELD OF THE INVENTION

This invention pertains to stabilized cleaning and stripping compositions for microelectronic substrates and particularly for cleaning bulk photoresist, unashed polymeric residues, and ashed residues, from patterned microelectronic substrates with consequent low or essentially no metal corrosion. While the invention is especially effective at cleaning polymer from aluminum-based and copper-based microelectronics device components without causing undue aluminum or copper corrosion, it is also effective in removing polymer from other microelectronics applications while protecting metals and substrates from corrosion. Among the processes the invention is effective in cleaning and protecting are those used in hard disk manufacture (with alloys of Fe, Co, Ni and Cr metals), wafer bumping processes, (such as PbSn, InSn, and other Pb-free solders), advanced front end of the line processes (SiGe, various metal gates), and compound semiconductors. The invention further relates to such cleaning compositions that also are able to clean post-ash residue from other vias and from metal lines as well as cleaning or stripping unashed photoresist from microelectronics substrates. A further aspect of this invention is a process of cleaning or stripping photoresist and residue from microelectronic components, especially aluminum-containing microelectronics components, without causing undue metal corrosion to metals found in numerous microelectronics processes.

BACKGROUND TO THE INVENTION

Many photoresist strippers and residue removers have been proposed for use in microelectronics manufacturing. Many stages of microelectronic device construction involve a thin film of photoresist which is deposited on a substrate material and imaged to produce the circuit design. The resulting image is utilized to pattern the underlying material, which could be a dielectric or metal layer, using plasma etch gases or solvent-based chemical etching. Following this etching step, the resist mask must be removed from the protected area of the substrate so that the next process operation can take place. The photoresist may be removed directly by wet chemical strippers, or largely removed by ashing of the bulk material followed by residue removal. Finding a cleaning composition for the removal of bulk resists and ashed residues can be challenging. The etching process can modify bulk polymer, increasing cross-linking and making the resist more difficult to remove. Similar cross-linking can be faced when the ashing step is partial or incomplete, and ashed residues on feature sidewalls can prove difficult to remove. Additionally, the cleaning solution must provide adequate cleaning while protecting all exposed metals and dielectrics from corrosion or etching. This is of particular interest in areas of microelectronic development requiring compatibility with numerous materials simultaneously, each with unique compatibility requirements.

Many alkaline microelectronic stripping and cleaning compositions have been proposed for the removal of cross-linked and hardened photoresists and other residues, such as post etch residues, from such microelectronic substrates. However, one problem with such stripping and cleaning composition is the possibility of metal corrosion occurring as a result of the use of such cleaning compositions. Such corrosion results in whiskers, pitting, notching of metal lines, and selective loss of metal from alloys due at least in part to the reaction of the metals in the device substrates with the alkaline strippers employed. One such alkaline microelectronic stripping and cleaning composition is that disclosed in U.S. Pat. No. 5,308,745. While the stripping and cleaning compositions of that patent have been commercially employed to strip hardened and cross-linked photoresist from substrates, it has been discovered that attempts to clean microelectronic substrates having various exposed metal layers with the cleaning composition of this patent has resulted in significant metal corrosion or insufficient cleaning of the resists or residues.

There is, therefore, a need for microelectronic stripping and cleaning compositions that can effectively remove bulk residues resists and ashed residues and do so without any significant metal corrosion or substrate attack resulting from the stripping and cleaning composition. There is also a need for such compositions that provide corrosion protection for numerous materials present in microelectronics manufacture exposed to the cleaning chemistry in the same cleaning step.

BRIEF SUMMARY OF THE INVENTION

In accordance with this invention, there are provided non-aqueous stripping and cleaning compositions for cleaning microelectronics devices, the composition comprising: at least one organic sulfur-containing polar compound as stripping solvent, at least one water-free source of a strong hydroxide base, and at least one hydroxypyridine stabilizing agent to inhibit detrimental side reactions. Other optional components, such as for example, co-solvents, surfactants or surface-active agents, metal chelating or complexing agents, and corrosion inhibitors may also be present in the non-aqueous stripping and cleaning compositions of this invention.

The non-aqueous stripping and cleaning composition of this invention for cleaning microelectronics devices will preferably generally comprise a liquid sulfoxide such as dimethyl sulfoxide (DMSO), a liquid sulfone such as sulfolane, or mixtures thereof as the organic sulfur containing polar compounds as stripping solvent in an amount of from about 20 wt % to about 99 wt % based on the weight of the composition, an alkaline metal hydroxide, ammonium hydroxide or quaternary ammonium hydroxide as the strong hydroxide base in an amount of from about 0.5 wt % to about 20 wt % based on the weight of the composition, and 2- or 4-hydroxypyridine or mixtures thereof in an amount of from about 0.01 wt % to about 5 wt % based on the weight of the composition.

The method for cleaning microelectronic devices according to this invention comprises a method for cleaning microelectronic devices without producing any substantial metal corrosion, the process comprising contacting the microelectronic device with a non-aqueous cleaning composition for a time sufficient to clean the device, wherein the cleaning composition comprises at least one organic sulfur-containing polar compounds as stripping solvent, at least one water-free source of a strong hydroxide base, and at least one hydroxypyridine stabilizing agent, and optionally other additional components, such as for example, co-solvents, surfactants or surface-active agents, metal complexing or chelating agents and corrosion inhibitors.

DETAILED DESCRIPTION OF THE INVENTION AND PREFERRED EMBODIMENTS

The non-aqueous stripping and cleaning compositions of this invention for cleaning microelectronics devices comprise at least one organic sulfur-containing polar compound as stripping solvent, at least one water-free source of a strong hydroxide base, and at least one hydroxypyridine as a stabilizing agent to inhibit detrimental side reactions. Other optional components, such as for example, co-solvents, surfactants or surface-active agents, metal complexing or chelating agents and corrosion inhibitors may also be present in the non-aqueous stripping and cleaning compositions of this invention.

Any suitable organic sulfur-containing stripping solvent polar compound may be employed in the compositions of this invention. Examples of such suitable organic sulfur-containing polar compounds include, but are not limited to, liquid dialkyl sulfoxides and, liquid sulfones, and the like, especially dimethyl sulfoxide and sulfolane. Such compounds include, for example, sulfones of the formula $R^1$—S(O)(O)—$R^2$ where $R^1$ and $R^2$ are alkyl of 1 to 4 carbon atoms, liquid sulfoxides of the formula $R^1$—S(O)—$R^2$ where $R^1$ and $R^2$ are alkyl of 1 to 4 carbon atoms such as dimethyl sulfoxide (DMSO), and cyclic sulfoxides and sulfone compounds such as sulfolane (tetrahydrothiophene-1,1-dioxide) and the like. Such organic sulfur-containing polar compounds will be present in the composition in an amount of from about 20 wt % to about 99 wt %, preferably from about 25 wt % to about 90 wt %, and more preferably from about 50 wt % to about 90 wt %, based on the weight of the composition.

Any suitable non-aqueous strong hydroxide base may be employed in the compositions of this invention. Examples of such suitable non-aqueous strong hydroxide bases include, but are not limited to alkaline metal hydroxides, ammonium hydroxides and quaternary ammonium hydroxides. Metal free bases are preferred and quaternary ammonium bases, especially tetraalkylammonium hydroxides such as tetramethylammonium hydroxide and the like are even more preferred. The bases are preferably quaternary ammonium hydroxides, such as tetraalkyl ammonium hydroxides (including hydroxy- and alkoxy-containing alkyl groups generally of from 1 to 4 carbon atoms in the alkyl or alkoxy group but also including benzyl groups). The most preferable of these are tetramethylammonium hydroxide and trimethyl-2-hydroxyethylammonium hydroxide (choline). Examples of other usable quaternary ammonium hydroxides include: trimethyl-3-hydroxypropylammonium hydroxide, trimethyl-3-hydroxybutylammonium hydroxide, trimethyl-4-hydroxybutylammonium hydroxide, triethyl-2-hydroxyethylammonium hydroxide, tripropyl-2-hydroxyethylammonium hydroxide, tributyl-2-hydroxyethylammonium hydroxide, dimethylethyl-2-hydroxyethylammonium hydroxide, dimethyl di-(2-hydroxyethyl)ammonium hydroxide, monomethyltriethanolammonium hydroxide, tetraethylammonium hydroxide, tetrapropylammonium hydroxide, tetrabutylammonium hydroxide, tetraethanolammonium hydroxide, monomethyltriethylammonium hydroxide, monomethyltripropylammonium hydroxide, monomethyltributylammonium hydroxide, monoethyltrimethylammonium hydroxide, monoethyltributylammonium hydroxide, dimethyldiethylammonium hydroxide, dimethyldibutylammonium hydroxide, benzyltrimethylammonium hydroxide and the like and mixtures thereof. The amount of the at least one non-aqueous strong hydroxide base employed in the composition will generally be an amount of from about 0.5 wt % to about 20 wt %, preferably from about 0.5 wt % to about 10 wt %, and more preferably from about 0.5 wt % to about 5 wt %, based on the weight of the composition.

Any suitable hydroxypyridine compound may be employed as the stabilizing agent component in the compositions of this invention. As examples of such suitable hydroxypyridenes there may be mentioned 2-, 3-, and 4-hydroxypridines. The hydroxypyridine is preferably 2 or 4-hydroxypyrideine, more preferably 2-hydroxypyridine. The amount of the hydroxypyridine component in the compositions of this invention will generally be an amount of from about 0.01 wt % to about 5 wt %, preferably from about 0.01 wt % to about 2 wt %, and more preferably from about 0.01 wt % to about 0.5 wt %, based on the weight of the composition. The hydroxypyridine components of this composition is present as a stabilizing agent and is believed to provide the stabilizing effect on the composition by blocking reaction of the strong hydroxide base with the sulfur-containing organic solvent component. Without the presence of the hydroxypyridine stabilizing agent the composition pH, which is generally about 12, will fall and the composition will change color and lose it cleaning effectiveness.

By the term "non-aqueous" it is meant that there is present in the composition no more than about 2% water, preferably less than about 1% water, and more preferably 0.5% to essentially no water.

Any suitable organic co-solvent compound may optionally be included in the compositions of this invention, generally as carriers of the non-aqueous strong hydroxide bases or to improve overall solvent properties of the compositions. These co-solvents include, but are not limited to, aliphatic alcohols and polyols and their ethers such as methanol, ethylene glycol, propylene glycol, diethylene glycol, diethylene glycol monoalkyl ethers such as those of the formula $HOCH_2.CH_2$—O—$CH_2$—$CH_2$—O—R where R is an alkyl radical of from 1 to 4 carbon atoms, especially diethylene glycol monoethyl ether and the like, alkyl esters such as 1-methoxy-2-propyl acetate and γ-butyrolactone and the like, and other aprotic solvents. The co-solvent component, if present, may comprise from about 0.1 wt % up to about 30 wt %, preferably up to 25 wt %, and more preferable up to 20 wt % of the total weight of the composition.

The compositions of this invention may also optionally contain other additional components. Such optional additional components include metal-complexing or chelating agents, corrosion resisting compounds and surfactants or surface-active agents.

Organic or inorganic chelating or metal complexing agents are not required, but may optionally be included in the compositions of this invention, and offer substantial benefits, such as for example, improved product stability when incorporated into the non-aqueous cleaning compositions of this invention. Examples of suitable chelating or complexing agents include but are not limited to trans-1,2-cyclohexanediamine tetraacetic acid (CyDTA), ethylenediamine tetraacetic acid (EDTA), stannates; pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e.g. ethylenediamine tetra(methylene phosphonic acid) (EDTMP), diethylenetriamine penta(methylene phosphonic acid), triethylenetetramine hexa(methylene phosphonic acid). The metal complexing or chelating agent, if present in the composition, will be present in an amount of from 0.1 wt % to about 5 wt %, preferably from about 0.1 to about 2 wt % based on the weight of the composition.

The non-aqueous cleaning compositions of this invention can also optionally contain other corrosion inhibitors and similar non-corrosive components employed in microelectronic cleaner compositions. The compounds may include, but not limited to, resorcinol, gallic acid, propyl gallate, pyrogallol, hydroquinone, benzotriazole and derivatives of benzotriazole. These other corrosion inhibitors may be present in any suitable amount, generally in an amount of from about 0.1 wt % to about 5 wt %, preferably from about 0.1 wt % to about 3 wt %, and more preferably from about 0.2 wt % to about 2 wt %, based on the weight of the composition.

The compositions of the present invention may also optionally contain any suitable amphoteric, non-ionic, cationic or anionic surface active agent or surfactant. The addition of a surfactant will reduce the surface tension of the formulation and improve the wetting of the surface to be cleaned and therefore improve the cleaning action of the composition. Further, surfactant properties may aid the dispersion of particulates, facilitating better cleaning. Any suitable amphoteric, cationic or non-ionic surfactant may be employed in the compositions of this invention. Examples of especially suitable surfactants include, but are not limited to 3,5-dimethyl-1-hexyn-3-ol (Surfynol-61), ethoxylated 2,4,7,9-tetramethyl-5-decyne-4,7-diol (Surfynol-465), polytetrafluoroethylene cetoxypropylbetaine (Zonyl FSK), Zonyl FSH, Triton X-100, namely octylphenoxypolyethoxyethanol, and the like. The surfactant, if present in the composition, will generally be present in an amount of from 0.1 wt % to about 5 wt %, preferably 0.001 wt % to about 3 wt % based on the total weight of the composition.

A preferred composition of this invention comprises a composition of about 72 wt % DMSO, 18 wt % sulfolane, 1.4 wt % tetramethylammonium inhydroxide, in 8.1% propylene glycol, and 0.5 wt % 2-hydroxypyridine. Another preferred composition of this invention comprises a composition of 66% DMSO, 17.4% sulfolane, 14% propylene glycol, 2.4% TMAH and 0.2% 2-hydroxypyridine.

The compositions of this invention and their effectiveness as cleaning compositions for cleaning microelectronic devices are illustrated by the following examples.

EXAMPLE 1

The tests below demonstrate the necessity of the hydroxypyridine stabilizing additive to the formulation. Solution 1 contained, by weight: 66% DMSO, 22% sulfolane, 11.2% propylene glycol, and 0.8% TMAH. Solution 2 contained: 66% DMSO, 22% sulfolane, 10.2% propylene glycol and 1.8% TMAH. To each of these solutions was added 0.5% 2-hydroxypyridine (HP) as noted below. Each solution was heated to 85 C and monitored over time. In the unstabilized baths (those containing no hydroxypyridine) decreasing pH was indicated by a bath color change. At or below this point the bath would not show efficient cleaning performance.

TABLE 1

| Solution | Time at 85 C. | Bath color |
| --- | --- | --- |
| Solution 1 | 0 hrs | Light Yellow |
| Solution 1 | 2 hrs | Light Yellow |
| Solution 1 | 4 hrs | Brown |
| Solution 1 + 0.5% 2-HP | 0 hrs | Light Yellow |
| Solution 1 + 0.5% 2-HP | 2 hrs | Light Yellow |

TABLE 1-continued

| Solution | Time at 85 C. | Bath color |
| --- | --- | --- |
| Solution 1 + 0.5% 2-HP | 4 hrs | Light Yellow |
| Solution 1 + 0.5% 2-HP | 7 hrs | Light Yellow |
| Solution 1 + 0.5% 2-HP | 22 hrs | Light Yellow |
| Solution 2 | 0 hrs | Yellow |
| Solution 2 | 2 hrs | Yellow |
| Solution 2 | 4 hrs | Brown |
| Solution 2 + 0.5% 2-HP | 0 hrs | Yellow |
| Solution 2 + 0.5% 2-HP | 2 hrs | Yellow |
| Solution 2 + 0.5% 2-HP | 4 hrs | Yellow |
| Solution 2 + 0.5% 2-HP | 7 hrs | Yellow |
| Solution 2 + 0.5% 2-HP | 22 hrs | Yellow |

EXAMPLE 2

The following tests support of novel and unexpected aspect of the present invention relative to the disclosure in U.S. Pat. Nos. 6,599,370 and 6,585,825 of David Skee. In these patents of Skee, a number of compounds were disclosed as being effective bath life extenders for aqueous solutions containing TMAH and metal free silicates. The bath life extending compounds in those Skee patents were employed as buffering agents in those aqueous compositions. However, the compositions of the present invention are non-aqueous compositions and thus the hydroxypyridine stabilizing compounds are not able to perform as buffering agents. Thus, it was totally surprising that the hydroxypyridine compounds are able to act as stabilizers in the non-aqueous compositions of this invention, whereas the other buffering agents of the Skee patents are not able to do so, as demonstrated by the results set forth in Table 2. For each test, Solution 2 from above (66% DMSO, 22% sulfolane, 10.2% propylene glycol, and 1.8% TMAH) was combined with various additives such that the additive was 1% of the total solution weight. The solutions were then heated at 85° C. for 24 hours. The performance of the additives were determined to be good if the bath had not changed color or dropped below pH=11 in 24 hours, fair if that bath was stable between 7-24 hours, and failed if the bath changed at less than 7 hours.

TABLE 2

| Compound added | Result |
| --- | --- |
| ascorbic acid | Fail |
| acetone oxime | Fail |
| Resorcinol | Fail |
| 2-hydroxypyridine | Good |
| 2-methylresocinol | Fail |
| 4-hydroxypyridine | Fair |
| Saccharine | Fail |

EXAMPLE 3

A cleaning solution (Solution 3) was prepared and contained about: 66% DMSO, 17.4% sulfolane, 14% propylene glycol, 2.4% TMAH and 0.2% 2-hydroxypyridine. Patterned Al technology wafer samples with "punch-through" via structures (vias etch through Si and TiN to an Al layer) were placed in these solutions of heated to the temperatures described in Table 3 for 10 minutes after which they were removed, rinsed in Dl water for two minutes and blown dry with nitrogen. For comparison, the same wafers were cleaned in ALEG-625 (J. T. Baker) a commercially available semi-aqueous product of otherwise similar composition (containing DMSO, sulfolane, TMAH, and water). The cleaned wafers were then evaluated for ash residue removal (0-100% removal) and aluminum corrosion (0-100% exposed Al metal loss).

TABLE 3

| Cleaning Solution | Temperature (C.) | Aluminum corrosion | Ash residue removal |
|---|---|---|---|
| Solution 3 | 45 | 0 | 100 |
| Solution 3 | 65 | 0 | 100 |
| Solution 3 | 85 | 0 | 100 |
| ALEG-625 | 45 | 100 | 100 |
| ALEG-625 | 65 | 100 | 100 |
| ALEG-625 | 85 | 100 | 100 |

EXAMPLE 4

A cleaning solution (Solution 3) was prepared and contained about: 66% DMSO, 17.4% sulfolane, 14% propylene glycol, 2.4% TMAH and 0.2% 2-hydroxypyridine-66% DMSO. Etch rates for blanket Al and Cu wafers were determined through exposure of wafers to the chemistry for set intervals and measurement of changes in metal thickness by four point probe. For comparison, the same wafers were cleaned in ALEG-625 (J. T. Baker) a commercially available semi-aqueous product of otherwise similar composition. The results at various representative operating temperatures are tabulated below.

TABLE 4

|  | Temperature (C.) | Solution 3 | ALEG-625 |
|---|---|---|---|
| Aluminum etch rate (A/min) | 65 | 0.5 | 181 |
| Copper etch rate (A/min) | 40 | 0.5 | 37 |
|  | 65 | 1.93 | 78 |

EXAMPLE 5

Cleaning solution 3 from the previous example was used to remove photoresist from a patterned wafer with exposed Cr features and a separate wafer with PbSn solder bumps. The cleaning and compatibility of this solution was compared to ALEG-625 as in the previous example. In each case, wafer samples were exposed to solution for a set time and temperature, then rinsed for 1 min in DI water and dried under flowing $N_2$. SEM analysis of the samples was used to determine cleaning efficiency and compatibility. Cleaning efficiency is presented as a percentage of photoresist removed, while a solution is determined to be incompatible if any observed pitting or change in feature shape is observed.

TABLE 5

| Test device | Time (min) | Temp. (C.) | Solution 3 | ALEG-625 |
|---|---|---|---|---|
| Cr wafer cleaning | 30 | 65 | 100% | 100% |
| Cr wafer compatibility |  |  | Compatible | Incompatible |
| PbSn bump cleaning | 40 | 85 | 100% | 80% |
| PbSn bump compatibility |  |  | Compatible | Incompatible |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A non-aqueous stripping and cleaning composition for cleaning microelectronics devices, the composition comprising:
    a) at least one organic sulfur-containing polar compound as stripping solvent,
    b) at least one water-free source of a strong hydroxide base, and
    c) at least one hydroxypyridine stabilizing agent.

2. A composition according to claim 1 wherein the at least one organic sulfur-containing polar compound as stripping solvent is present in the composition in an amount of from about 20 wt % to about 99 wt %, based on the weight of the composition, the water free source of a strong hydroxide base is present in the composition in an amount of from about 0.5 wt % to about 20 wt % based on the weight of the composition, and the hydroxypyridine is present in the composition in an amount of from about 0.01 wt % to about 5 wt % based on the weight of the composition.

3. A composition according to claim 2 wherein the at least one at least one organic sulfur-containing polar compound as stripping solvent is selected from the group consisting of sulfoxides, sulfones, sulfolanes, and mixtures thereof; the water free source of a strong hydroxide base is selected from alkaline hydroxides, ammonium hydroxide, and quaternary ammonium hydroxides and mixtures thereof; and the at least one hydroxypyridine is selected from 2-hydroxypyridine, 4-hydroxypyridine and mixtures thereof.

4. A composition according to claim 3 wherein the at least one at least one organic sulfur-containing polar compound as stripping solvent is selected from the group consisting of dimethyl sulfoxide, sulfolane, and mixtures thereof; the water free source of a strong hydroxide base is selected from tetraalkylammonium hydroxides; and the at least one hydroxypyridine is selected from 2-hydroxypyridine.

5. A composition according to claim 4 wherein the composition comprises dimethyl sulfoxide, sulfolane, tetramethylammonium hydroxide and 2-hydroxypyridine.

6. A composition according to claim 5 the composition also comprises propylene glycol.

7. A composition according to claim 6 wherein the dimethyl sulfoxide is present in an amount of about 66 wt %, the sulfolane is present in an amount of about 17.4 wt %, the tetramethylammonium hydroxide is present in an amount of about 2.4 wt %, the propylene glycol is present in an amount of about 14 wt %, and the 2-hydroxypyridine is present in an amount of about 0.2 wt %.

8. A composition according to claim 1 additionally comprising one or more components selected from the group consisting of: metal-chelating or complexing agents, co-solvents, corrosion resisting compounds, and surface-active agents or surfactants.

9. A method for cleaning a microelectronic device substrate without producing any substantial metal corrosion, the process comprising contacting the device with a cleaning composition for a time sufficient to clean the device, wherein the cleaning composition comprises a composition of claim 1.

10. A method for cleaning a microelectronic device substrate without producing any substantial metal corrosion, the process comprising contacting the device with a cleaning composition for a time sufficient to clean the device, wherein the cleaning composition comprises a composition of claim 2.

11. A method for cleaning a microelectronic device substrate without producing any substantial metal corrosion, the process comprising contacting the device with a cleaning composition for a time sufficient to clean the device, wherein the cleaning composition comprises a composition of claim 3.

12. A method for cleaning a microelectronic device substrate without producing any substantial metal corrosion, the process comprising contacting the device with a cleaning composition for a time sufficient to clean the device, wherein the cleaning composition comprises a composition of claim 4.

13. A method for cleaning a microelectronic device substrate without producing any substantial metal corrosion, the process comprising contacting the device with a cleaning composition for a time sufficient to clean the device, wherein the cleaning composition comprises a composition of claim 5.

14. A method for cleaning a microelectronic device substrate without producing any substantial metal corrosion, the process comprising contacting the device with a cleaning composition for a time sufficient to clean the device, wherein the cleaning composition comprises a composition of claim 6.

15. A method for cleaning a microelectronic device substrate without producing any substantial metal corrosion, the process comprising contacting the device with a cleaning composition for a time sufficient to clean the device, wherein the cleaning composition comprises a composition of claim 7.

16. A method for cleaning a microelectronic device substrate without producing any substantial metal corrosion, the process comprising contacting the device with a cleaning composition for a time sufficient to clean the device, wherein the cleaning composition comprises a composition of claim 8.

* * * * *